United States Patent [19]
Li et al.

[11] Patent Number: 5,613,218
[45] Date of Patent: Mar. 18, 1997

[54] METHOD AND APPARATUS IN A RADIO COMMUNICATION SYSTEM FOR MITIGATING NOISE AND INTERFERENCE EFFECTS

[75] Inventors: Xiaojun Li, Boynton Beach; Sunil Satyamurti, Delray Beach; Thomas V. D'Amico, Boca Raton, all of Fla.

[73] Assignee: Motorola, Inc., Schaumburg, Ill.

[21] Appl. No.: 520,067

[22] Filed: Aug. 28, 1995

[51] Int. Cl.$^6$ ........................................ H04B 1/46
[52] U.S. Cl. .................. 455/71; 455/47; 455/296; 455/312
[58] Field of Search ........................ 455/52.1, 52.3, 455/47, 63, 65, 67.4, 71, 203, 296, 312, 220, 221, 222, 70; 375/231, 317, 346, 348

[56] References Cited

U.S. PATENT DOCUMENTS

| | | |
|---|---|---|
| 4,726,069 | 2/1988 | Stevenson ........................ 455/71 |
| 4,875,038 | 10/1989 | Siwiak et al. . |
| 4,955,083 | 9/1990 | Phillips et al. ........................ 455/47 |
| 5,168,493 | 12/1992 | Nelson et al. . |

*Primary Examiner*—Reinhard J. Eisenzopf
*Assistant Examiner*—Tuyen Q. Vu
*Attorney, Agent, or Firm*—R. Louis Breeden

[57] ABSTRACT

A method and apparatus for mitigating effects of multipath fading, interference, and noise in a single sideband (SSB) signal transmitted by a radio communication system and demodulated by a portable subscriber unit (122) utilizing a demodulator (304) compensated by a pilot signal power (406). The apparatus performs the mitigation process by calculating (708) a pilot fading threshold in addition to a muting threshold. When samples of the mean pilot signal power fall below the fading threshold, the compensation of the demodulated signal is adjusted (714). In addition, when the mean analog message signal power falls below the muting threshold, the samples included in the predetermined portion of the message are muted (718).

21 Claims, 11 Drawing Sheets

METHOD AND APPARATUS IN A RADIO COMMUNICATION SYSTEM FOR MITIGATING NOISE AND INTERFERENCE EFFECTS

RELATED APPLICATIONS

Application Ser. No. 08/397,322 filed Feb. 28, 1995 by Gorday et al., entitled "Method and Apparatus for Determining a Quality Level of an Analog Signal in a Radio Communication System."

Application Ser. No. 08/395,747 filed Feb. 28, 1995 by Leitch et al., entitled "Voice Compression Method and Apparatus in a Communication System."

Application Ser. No. 08/493,041 filed Jun. 21, 1995 by D'Amico et al., entitled "Method and Apparatus for Implementing a Received Signal Quality Measurement in a Radio Communication System."

FIELD OF THE INVENTION

This invention relates in general to radio communication systems, and more specifically to a method and apparatus in a radio communication system for mitigating noise and interference effects.

BACKGROUND OF THE INVENTION

A radio communication system with two-way communication between base stations and portable subscriber units provides an important means for the base stations to determine the reliability of a message transaction. Digital error detection techniques have worked well for prior art systems which use frequency modulation (FM) for digital message communication. Such messages are typically numeric or alpha-numeric messages. With today's technology improvements in speech algorithms and microcomputer processing, the demand for new services which require higher data rates makes standard FM modulation no longer suitable. To resolve this problem, other prior art systems have developed modulation signaling formats, such as mixed signaling systems which use both FM and linear modulation schemes.

Base stations which deliver mixed digital and analog messages to portable subscriber units can no longer rely on the portable subscriber units utilizing traditional digital error correction techniques to reconstruct impaired analog messages.

Thus, what is needed is a method and apparatus in a radio communication system for mitigating noise and interference effects. In particular, a method and apparatus is needed that can be utilized for error mitigation of impaired analog messages.

SUMMARY OF THE INVENTION

An aspect of the present invention is a method for mitigating effects of multipath fading, interference, and noise in a single sideband (SSB) signal transmitted by a radio communication system and demodulated by a portable subscriber unit utilizing a demodulator compensated by a pilot signal. The method comprises in the portable subscriber unit the steps of calculating a pilot fading threshold $F_{th}$, wherein $F_{th}$ is calculated as a first predetermined function of a pilot threshold T and a predetermined desired signal/noise ratio $S_d$, and adjusting compensation of the demodulator whenever pilot signal power is equal to or less than $F_{th}$.

Another aspect of the present invention is a portable subscriber unit for mitigating effects of multipath fading, interference, and noise in a single sideband (SSB) signal transmitted by a radio communication system and demodulated by the portable subscriber unit utilizing a demodulator compensated by a pilot signal. The portable subscriber unit comprises a receiver for receiving the SSB signal, a processing system coupled to the receiver for controlling operation of the portable subscriber unit, and a power measurement element coupled to the receiver and coupled to the processing system for measuring mean power received in portions of the SSB signal. The receiver further comprises a demodulator coupled to the processing system and compensated by a pilot signal. The processing system is programmed for calculating a pilot fading threshold $F_{th}$, and $F_{th}$ is calculated as a first predetermined function of a pilot threshold T and a predetermined desired signal/noise ratio $S_d$. The processing system is further programmed for adjusting compensation of the demodulator whenever pilot signal power is equal to or less than $F_{th}$.

A third aspect of the present invention is a radio communication system for mitigating effects of multipath fading, interference, and noise in a single sideband (SSB) signal transmitted by the radio communication system and demodulated by a portable subscriber unit utilizing a demodulator compensated by a pilot signal. The radio communication system comprises a controller, comprising a first processing system for controlling operation of the controller, an input interface coupled to the first processing system for accepting a message from a message originator, and a transmitter controller coupled to the first processing system for controlling a plurality of transmitters positioned in a plurality of coverage zones. The radio communication system further comprises the plurality of transmitters coupled to the controller for transmitting the SSB signal, and the portable subscriber unit, comprising a receiver for receiving the SSB signal, a second processing system coupled to the receiver for controlling operation of the portable subscriber unit, and a power measurement element coupled to the receiver and coupled to the second processing system for measuring mean power received in portions of the SSB signal. The receiver further comprises a demodulator coupled to the second processing system and compensated by a pilot signal. The second processing system is programmed for calculating a pilot fading threshold $F_{th}$, and $F_{th}$ is calculated as a first predetermined function of a pilot threshold T and a predetermined desired signal/noise ratio $S_d$. The second processing system is further programmed for adjusting compensation of the demodulator whenever pilot signal power is equal to or less than $F_{th}$.

DESCRIPTION OF THE PREFERRED EMBODIMENT

Figure 1:
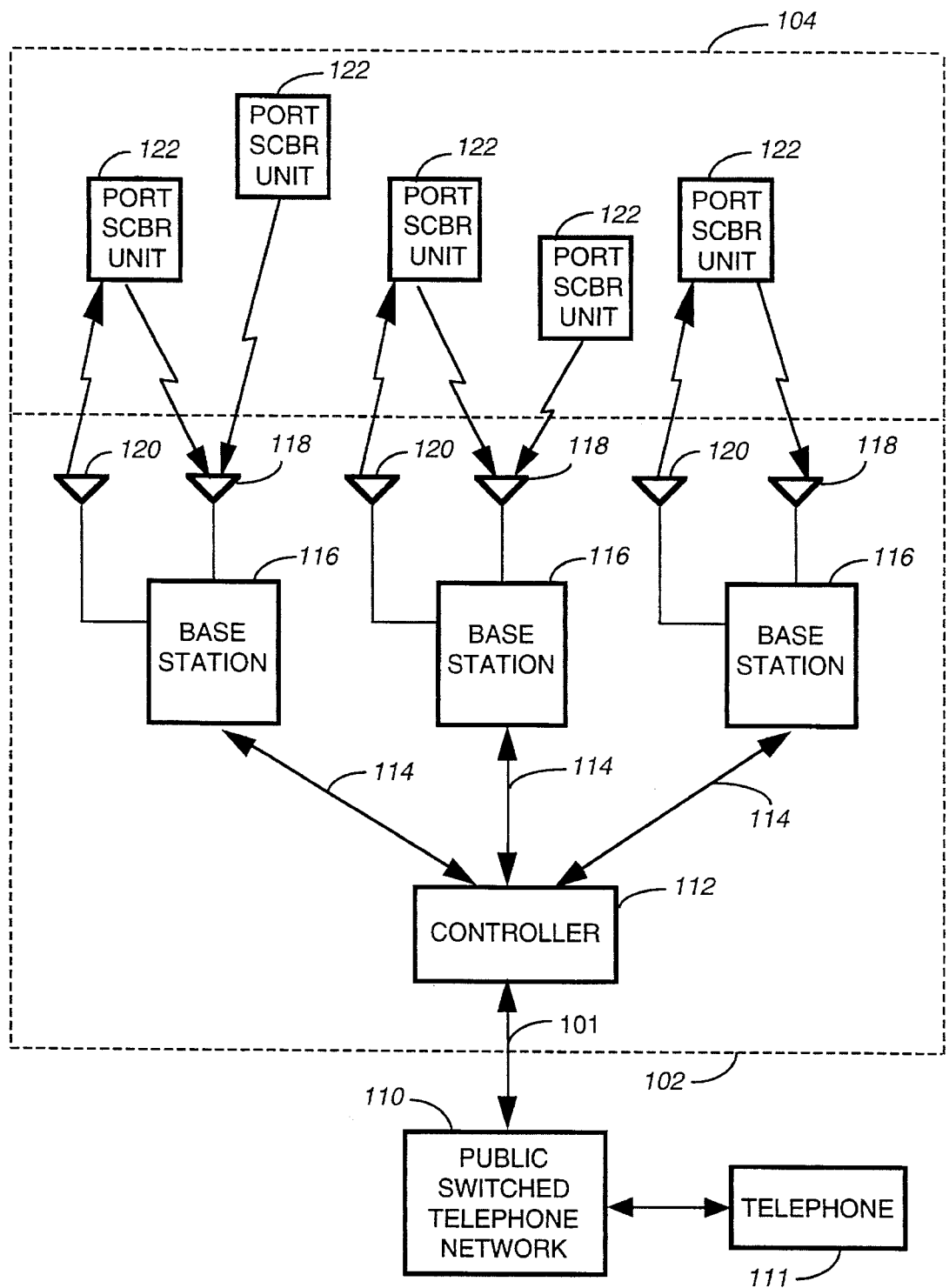
FIG. 1 is an electrical block diagram of a radio communication system in accordance with the preferred embodiment of the present invention.

Referring to FIG. 1, an electrical block diagram of a communication system in accordance with the preferred embodiment of the present invention comprises a fixed portion 102 and a portable portion 104. The fixed portion 102 includes a plurality of base stations 116, for communicating with the portable portion 104, utilizing conventional radio frequency (RF) techniques well known in the art, and coupled by communication links 114 to a controller 112 which controls the base stations 116. The hardware of the controller 112 is preferably a combination of the Wireless Messaging Gateway (WMG™) Administrator! paging terminal, and the RF-Conductor!™ message distributor manufactured by Motorola, Inc. The hardware of the base stations 116 is preferably a combination of the Nucleus® Orchestra! transmitter and RF-Audience!™ receivers manufactured by Motorola, Inc. It will be appreciated that other similar hardware can be utilized for the controller 112 and the base stations 116.

Each of the base stations 116 transmits RF signals to the portable portion 104 comprising a plurality of portable subscriber units 122 via a transmitting antenna 120. The base stations 116 each receive RF signals from the plurality of portable subscriber units 122 via a receiving antenna 118. It will be appreciated that, alternatively, the base stations 116 are utilized for RF transmissions only (i.e., one-way transmission). The RF signals transmitted by the base stations 116 to the portable subscriber units 122 (outbound messages) comprise selective call addresses identifying the portable subscriber unit 122, and data or voice messages originated by a caller.

The RF signals transmitted by the portable subscriber units 122 to the base stations 116 (inbound messages) comprise positive acknowledgments (ACKs) which indicate the message was received reliably by the portable subscriber unit 122, or negative acknowledgments (NAKs) which indicate the portable subscriber unit 122 did not receive the message reliably. A detailed description of inbound acknowledge-back messaging is more fully described in U.S. Pat. No. 4,875,038 issued Oct. 17, 1989 to Siwiak et al., which is hereby incorporated herein by reference. It will be appreciated that, alternatively, the portable subscriber units 122 are utilized for RF reception only (i.e., one-way receivers).

The controller 112 preferably is coupled by telephone links 101 to a public switched telephone network (PSTN) 110 for receiving selective call originations therefrom. Selective call originations comprising voice and data messages from the PSTN 110 can be generated, for example, from a conventional telephone 111 coupled to the PSTN 110 in a manner that is well known in the art.

Voice messages transmitted by the base stations 116 utilize mixed signaling techniques. A voice message includes a digital message portion and an analog message portion. The digital message portion includes at least the addressing information which is used to identify the portable subscriber unit 122, and a message vector identifying the location of the analog message. The digital message portion is preferably similar to Motorola's well-known FLEX™ digital selective call signaling protocol as described more fully in U.S. Pat. No. 5,168,493 issued Dec. 1, 1992 to Nelson et al., which is hereby incorporated herein by reference. This protocol utilizes well-known error detection and error correction techniques and is therefore tolerant to bit errors occurring during transmission, provided that the bit errors are not too numerous in any one code word.

Outbound channel transmissions of the digital message portion transmitted by the base stations 116 preferably utilize two and four-level frequency shift keyed (FSK) modulation, operating at sixteen hundred or thirty two hundred symbols-per-second (sps), depending on traffic requirements and system transmission gain. Outbound channel transmissions of the analog message portion transmitted by the base stations 116 preferably utilize single side band (SSB) transmission. A voice message preferably comprises an upper side band (USB), a lower side band (LSB) and a pilot carrier. It will be appreciated that, alternatively, a voice message can comprise the pilot carrier and a single one of the sidebands. A detailed explanation of the preferred analog voice messaging system can be found in U.S. patent application Ser. No. 08/395,747 filed Feb. 28, 1995 by Leitch et al., which is hereby incorporated herein by reference. Inbound channel transmissions from the portable subscriber units 122 to the base stations 116 preferably utilize four-level FSK modulation at a rate of eight hundred bits per second (bps). Inbound channel transmissions preferably occur during predetermined data packet time slots synchronized with the outbound channel transmissions. The outbound and inbound channels preferably operate on separate carrier frequencies utilizing frequency division multiplex (FDM) techniques well known in the art. A detailed description of FDM techniques is more fully described in U.S. Pat. No. 4,875,038 issued to Siwiak et al. It will be appreciated that, alternatively, the outbound and inbound channels can operate on a single carrier frequency using time division duplex (TDD) techniques as described more fully in U.S. Pat. No. 5,168,493 issued to Nelson et al. It will be further appreciated that, alternatively, other signaling protocols, modulation schemes, and transmission rates can be utilized for either or both transmission directions.

Figure 2:
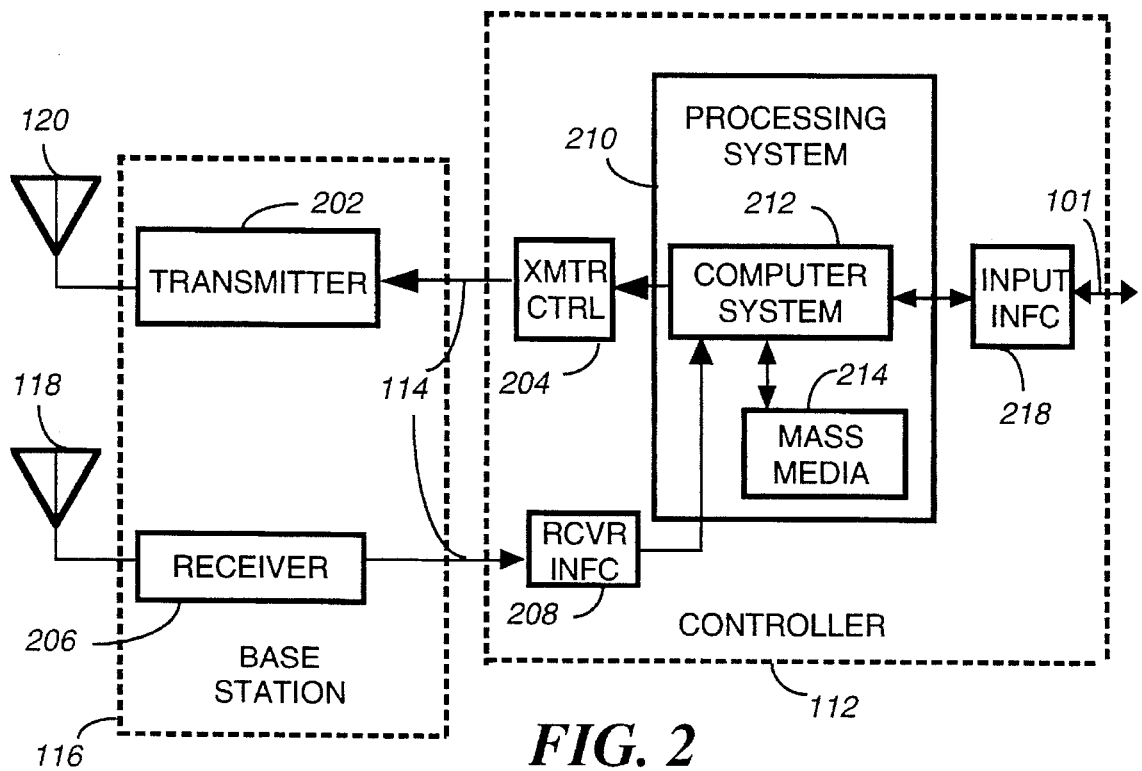
FIG. 2 is an electrical block diagram of elements of a fixed portion of the radio communication system in accordance with the preferred embodiment of the present invention.

Referring to FIG. 2, an electrical block diagram of elements of the fixed portion 102 in accordance with the preferred embodiment of the present invention comprises portions of the controller 112 and the base stations 116. The controller 112 comprises a processing system 210 for directing operation of the controller 112. The processing system 210 preferably is coupled through a transmitter controller 204 to a transmitter 202 via the communication links 114. The communication links 114 use conventional means well known in the art, such as a direct wire line (telephone) link, a data communication link, or any number of radio frequency links, such as a radio frequency (RF) transceiver link, a microwave transceiver link, or a satellite link, just to mention a few. The transmitter 202 transmits two and four-level FSK data messages to the portable subscriber units 122 during a digital message portion, and LSB, USB and a pilot during the analog message portion for voice messages. The processing system 210 is also coupled to at least one receiver 206 through a receiver interface 208 via the communication links 114. The receiver 206 demodulates four-level FSK and is preferably collocated with the base stations 116, as implied in FIG. 2, but can be positioned remote from the base stations 116 to avoid interference from the transmitter 202. The receiver 206 is for receiving one or more acknowledgments (ACKs or NAKs) from the portable subscriber units 122.

The processing system 210 is also coupled to an input interface 218 for communicating with the PSTN 110 through the telephone links 101 for receiving selective call originations from a message originator. In order to perform the functions (to be described below) necessary in controlling the elements of the controller 112, as well as the elements of the base stations 116, the processing system 210 preferably includes a conventional computer system 212, and conventional mass storage media 214. The conventional mass storage media 214 also includes subscriber user information such as, for example, portable subscriber unit 122 addressing, programming options, etc. The conventional computer system 212 is programmed by way of software included in the conventional mass storage media 214. The conventional computer system 212 preferably comprises a plurality of processors such as VME Sparc processors manufactured by Sun Microsystems, Inc. These processors include memory such as dynamic random access memory (DRAM), which serves as a temporary memory storage device for scratch pad processing such as, for example, storing 5 messages originated by callers using the PSTN 110, processing acknowledgments received from the portable subscriber units 122, and for protocol processing of messages destined for the portable subscriber units 122, just to mention a few. The conventional mass storage media 214 is preferably a conventional hard disk mass storage device.

It will be appreciated that other types of conventional computer systems 212 can be utilized, and that additional computer systems 212 and mass storage media 214 of the same or alternative type can be added as required to handle the processing requirements of the processing system 210.

Figure 3:
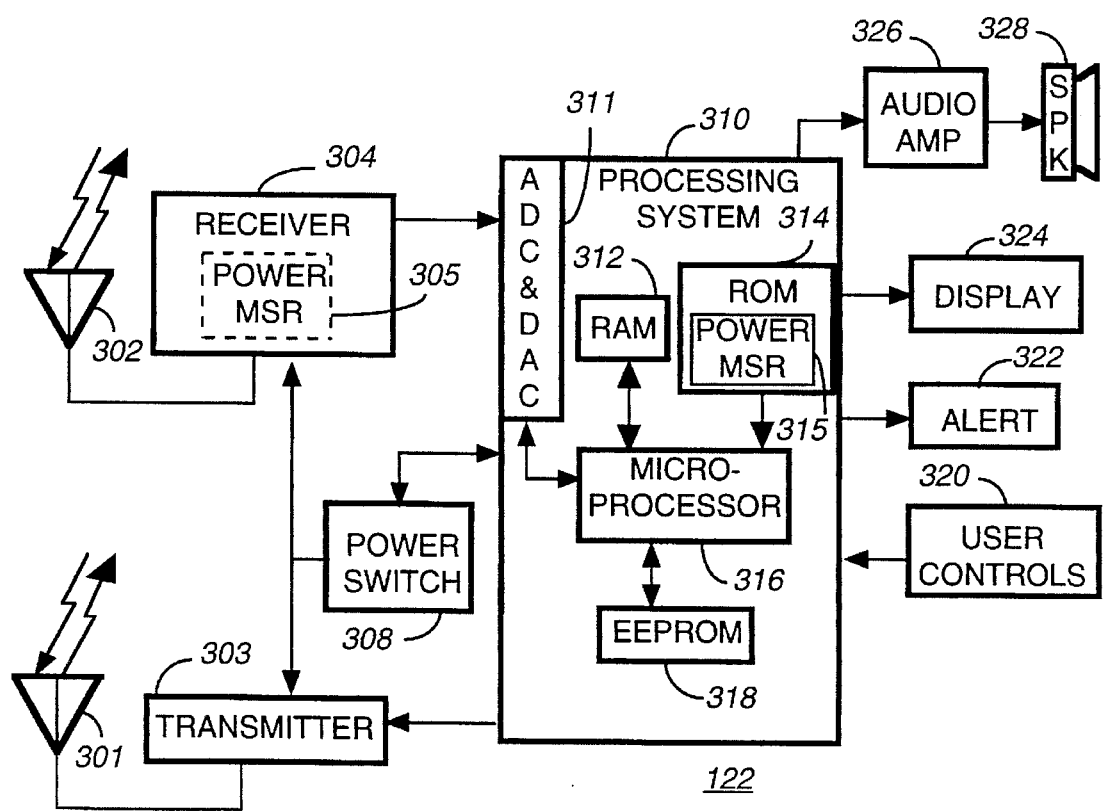
FIG. 3 is an electrical block diagram of a portable subscriber unit in accordance with the preferred embodiment of the present invention.

Referring to FIG. 3, an electrical block diagram of the portable subscriber unit 122 in accordance with the preferred embodiment of the present invention comprises a receiver antenna 302 and transmitter antenna 301 for intercepting RF signals from the base stations 116 and for transmitting RF signals to the base stations 116, respectfully. The receiver antenna 302 is coupled to a conventional receiver 304 which comprises a demodulator for demodulating the RF signals received from the base stations 116. The transmitter antenna 301 is coupled to a conventional transmitter 303 for modulating RF signals transmitted to the base stations 116. The RF signals received from the base stations 116 use conventional two and four-level FSK. The RF signals transmitted by the portable subscriber unit 122 to the base stations 116 use four-level FSK. Radio signals received by the receiver 304 produce demodulated information at the output. The demodulated information is coupled to the input of a processing system 310, which processes outbound messages. During inbound signaling, acknowledgment messages are processed by the processing system 310 and delivered to the transmitter 303 for transmission. A conventional power switch 308, coupled to the processing system 310, is used to control the supply of power to the transmitter 303 and receiver 304, thereby providing a battery saving function.

As part of the demodulation process, the demodulator compensates for variations in the pilot signal (which substantially correlates to a change in the analog voice message) by dividing the analog voice message by the pilot signal. This compensation in effect normalizes the analog voice message signal. The discrete sampled normalized SSB signal takes the form $$I_n(k) + jQ_n(k) = \frac{I(k) + jQ(k)}{I_p(k) + jQ_p(k)} \cdot P_N$$

where $I(k)+jQ(k)$ is the discrete SSB signal, $I_p(k)+jQ_p(k)$ is the discrete pilot signal, $I_p(k)+jQ_p(k)$ is the discrete normalized result, and $P_N$ is a predetermined nominal pilot signal amplitude. Multiplying the numerator and denominator of the above expression by the complex conjugate of the discrete pilot signal results in the equation $$I_n(k) + jQ_n(k) = \frac{(I(k) + jQ(k)) \cdot (I_p(k) - jQ_p(k))}{(I_p^2(k) + Q_p^2(k))} \cdot P_N.$$

Figure 4:
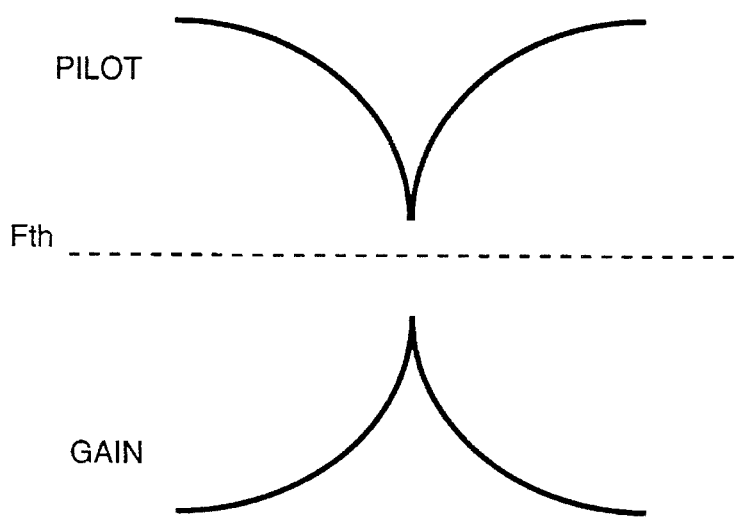
FIG. 4 is a diagram illustrating demodulator compensation above the fading threshold in accordance with the preferred embodiment of the present invention.

This equation in effect compensates for both amplitude and phase variations in the pilot carrier signal. As a result, the SSB signal plus noise components (i.e., I+N) are compensated by the demodulator. This, however, has the adverse effect of amplifying the noise components when the pilot carrier signal degrades, as illustrated in FIG. 4 by the gain applied to the SSB signal plus noise.

However, as long as the pilot signal power does not fall below the fading threshold ($F_{th}$), as will be discussed below, the quality of the analog voice message should not be compromised by the rise in amplitude of the noise terms. It will be appreciated that, alternatively, the compensation function performed by the receiver 304 can be performed by the processing system 310 by way of firmware.

To perform the necessary functions of the portable subscriber unit 122, the processing system 310 includes a microprocessor 316, a RAM 312, a ROM 314, an EEPROM 318, and a combined analog to digital converter (ADC) and digital to analog converter (DAC) 311. Preferably, the microprocessor 316 is similar to the DSP56100 digital signal processor (DSP) manufactured by Motorola, Inc. It will be appreciated that other similar processors can be utilized for the microprocessor 316, and that additional processors of the same or alternate type can be added as required to handle the processing requirements of the processing system 310. It will be appreciated that other types of memory, e.g., EEPROM or FLASH, can be utilized for the ROM 314, as well as the RAM 312. It will be further appreciated that the RAM 312 and the ROM 314, singly or in combination, can be integrated as a contiguous portion of the microprocessor 316.

The microprocessor 316 is programmed by way of the ROM 314 to process incoming messages on the outbound channel, and for creating acknowledgment messages on the inbound channel. During outbound message processing, the microprocessor 316 samples the demodulated signal generated by the receiver 304 using the ADC portion of the combined ADC and DAC 311 converting the demodulated signal to demodulated data. The microprocessor 316 then decodes an address in the demodulated data of the outbound message, compares the decoded address with one or more addresses stored in, the EEPROM 318, and when a match is detected, the microprocessor 316 proceeds to process the remaining portion of the message. Preferably, the ROM 314 includes a power measurement element 315 which instructs the microprocessor 316 on the procedure for performing signal quality measurements during message processing, details of which will be described below. It will be appreciated that, alternatively, a hardware power measurement element 305 included in the receiver 304 can be used to replace the software implemented power measurement element 315. The hardware power measurement element 305 is preferably one or more received signal strength indicators (RSSI) functionally similar to, for example, the MC13135 RSSI device manufactured by Motorola, Inc. Note each RSSI device measures the mean signal power for the pilot carrier and USB or LSB signals.

Once the microprocessor 316 has processed the message, it stores the message in the RAM 312, and a call alerting signal is generated to alert a user that a message has been received. The call alerting signal is directed to a conventional audible or tactile alerting device 322 for generating an audible or tactile call alerting signal. In addition, the microprocessor 316 is programmed to send the ACK or NAK depending on the quality of the received message. To send the acknowledgment, the microprocessor 316 utilizes the DAC portion of the combined ADC and DAC 311 to modulate the transmitter with the FSK data corresponding to the acknowledgment messages.

The message can be accessed by the user through user controls 320, which provide functions such as lock, unlock, delete, read, etc. More specifically, by the use of appropriate functions provided by the user controls 320, the message is recovered from the RAM 312, and then displayed on a display 324, e.g., a conventional liquid crystal display (LCD), or played out audibly, in the case of a voice message, by the combination of an audio amplifier 326 and a speaker 328.

Figure 5:
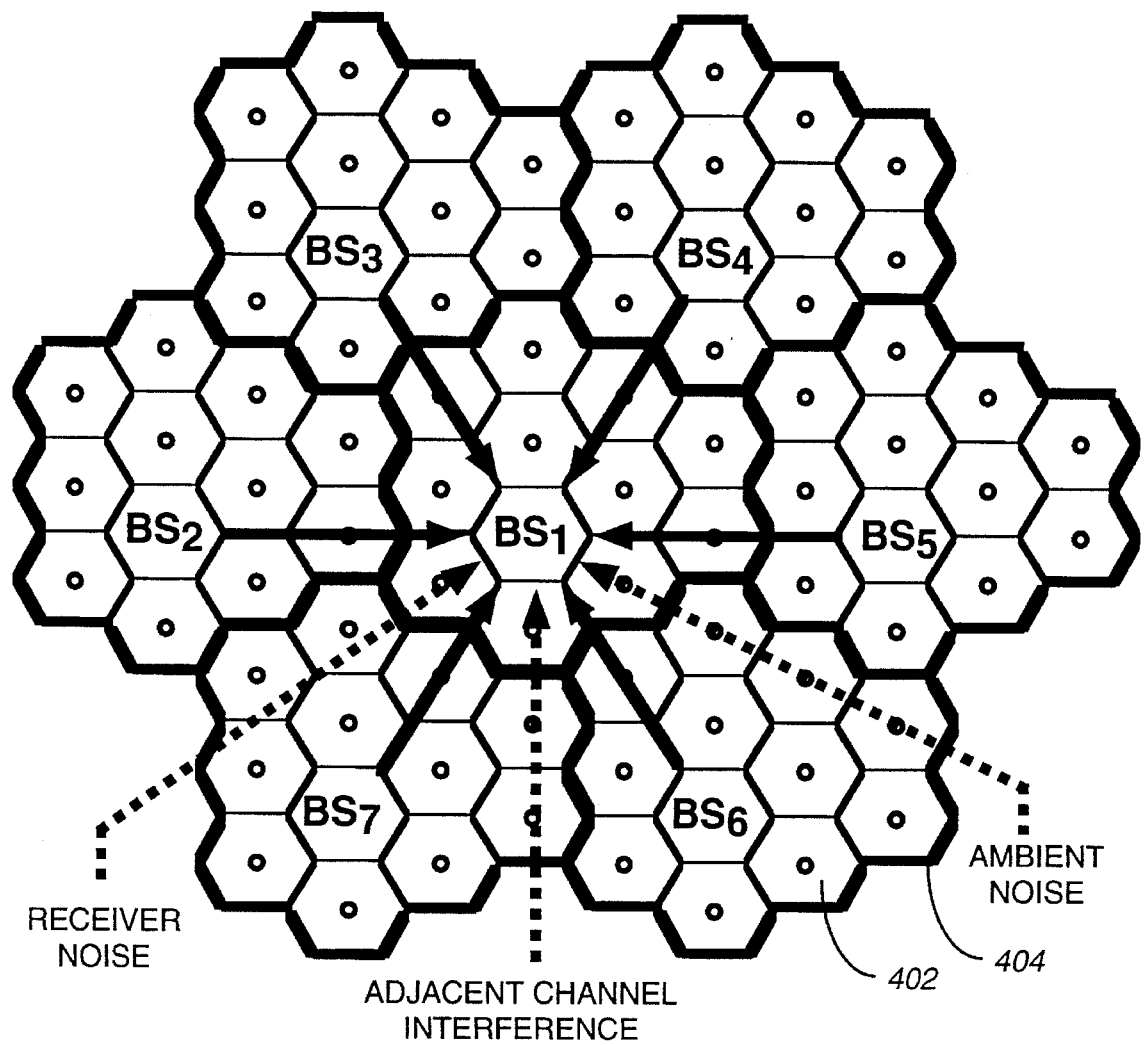
FIG. 5 is a coverage diagram of the radio communication system comprising a plurality of coverage zones grouped in coverage zone clusters in accordance with the preferred embodiment of the present invention.

FIG. 5 is a coverage diagram of the radio communication system comprising a plurality of coverage zones 402 grouped in coverage zone clusters 404 in accordance with the preferred embodiment of the present invention. The coverage zone clusters 404 preferably comprise twelve coverage zones 402. It will be appreciated that, alternatively, more or less coverage zones 402 can be used in the coverage zone clusters 404. Each coverage zone 402 within the coverage zone cluster 404 includes a base station 116 (e.g., BS1). In this example, base station 116 $BS_1$ within the coverage zone 402 has a corresponding set of base stations 116 $BS_2$, $BS_3$, $BS_4$, $BS_5$, $BS_6$, and $BS_7$ within coverage zones 402 of different coverage zone clusters 404 which transmit messages utilizing the same subchannel frequency. Thus, base stations 116 $BS_2$, $BS_3$, $BS_4$, $BS_5$, $BS_6$, and $BS_7$ are first tier co-channel interferers of $BS_1$. The co-channel interference is shown with solid arrows pointed into $BS_1$ from each of the base stations 116 $BS_2$, $BS_3$, $BS_4$, $BS_5$, $BS_6$, and $BS_7$. In addition to co-channel interference, transmissions from $BS_1$ also suffer from adjacent channel interference (shown with a dashed arrow) from base stations 116 in other coverage zones 402 which utilize adjacent subchannel frequencies. Additionally, ambient noise (shown with a dashed arrow) such as, for example, Guassian white noise spread throughout the radio communication system also contributes to the degradation of signals transmitted by $BS_1$. From the point of view of a portable subscriber unit 122 located within the coverage zone 402 of $BS_1$, transmitted signals from $BS_1$ are further degraded by the inherent noise of the receiver 304 of the portable subscriber unit 122. It is expected that co-channel interference is the most significant contributor to the degradation of signals transmitted by $BS_1$.

Normally in mixed signaling systems utilizing digital and analog transmission of voice messages, distortion in the transmitted message can be detected in the digital message portion with error detection or correction codes well known in the art. For the analog message portion, however, distortion in the transmitted message cannot readily be detected without some form of a signal quality measurement.

Figure 6:
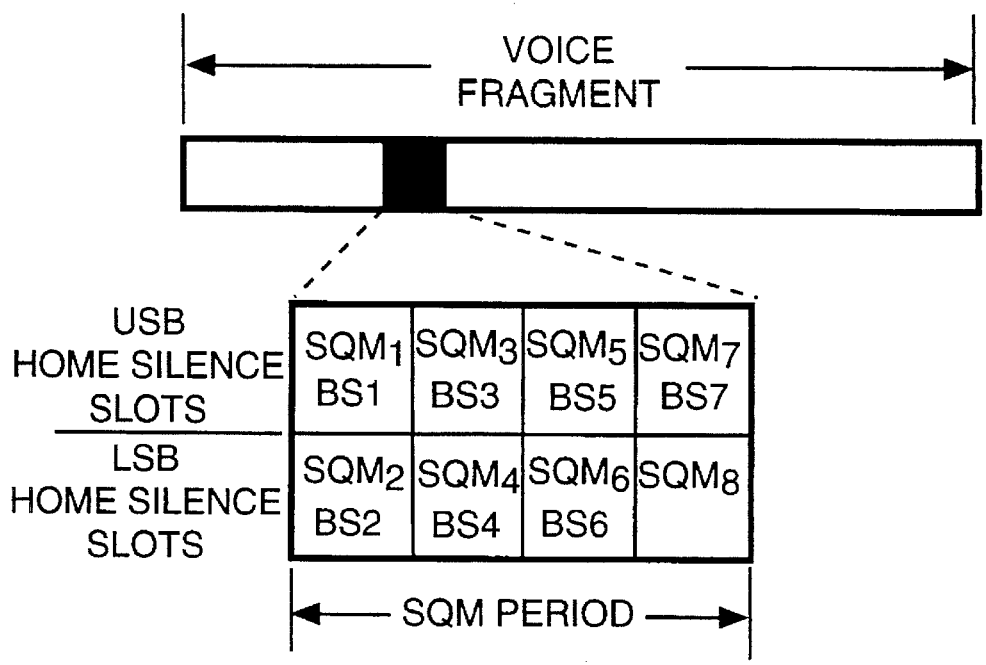
FIGS. 6 and 7 are first and second embodiments of a timing diagram of a plurality of predetermined synchronized signal quality measurement slots transmitted with the analog voice message in accordance with the present invention.

FIG. 6 is a timing diagram of a first embodiment of a plurality of predetermined synchronized signal quality measurement (SQM) slots transmitted with an analog voice message in accordance with the present invention. An analog voice message comprises one or more voice fragments. Within each voice fragment an SQM period is reserved for measurements that assist in predicting the signal quality of a received analog voice message. The SQM period comprises SQM slots ($SQM_1$ through $SQM_8$ shown by way of example). Preferably, the SQM slots are transmitted proximate the voice fragment, e.g., before or after the voice fragment and within the same protocol frame as the voice fragment. It will be appreciated that the SQM slots can be transmitted in other positions as well, such as within the voice fragment.

The SQM period is preferably 30 ms in duration, and the SQM slots are preferably 7.5 ms in duration. It will be appreciated that, alternatively, the SQM period and SQM slot duration can be of greater or lesser length than specified depending on the application. Each SQM slot represents analog transmission of an USB, or a LSB and an associated pilot carrier. In addition, each base station 116 is assigned to a side band corresponding to each SQM slot ($BS_1$, through $BS_7$ shown by way of example). The SQM slot assigned to each base station 116 is defined as a home silence slot. Base stations 116 $BS_1$, $BS_3$, $BS_5$, and $BS_7$ are assigned to the USB silence slots while base stations 116 $BS_2$, $BS_4$, and $BS_6$ are assigned to the LSB silence slots. In this example, there is no base station 116 represented by $SQM_8$, thus all base stations 116 transmit a tone in $SQM_8$, as described further below.

In the first embodiment of the present invention, the base stations 116 transmit a tone (e.g., 1 KHz) in all SQM slots excluding their home silence slot. In this embodiment only SQM slots 1 through 8 are utilized. In this method, a portable subscriber unit 122 in the coverage zone 402 of $BS_1$ in the SQM slot assigned to $BS_1$ receives a tone signal from $BS_2$ through $BS_8$. Similarly, in the silence slot assigned to $BS_2$ the portable subscriber unit 122 receives a tone signal from $BS_1$, $BS_3$, $BS_4$, $BS_5$, $BS_6$, and $BS_7$, and so on. Transmitting tones in this manner provides a portable subscriber unit 122 located in the coverage zone 402 of $BS_1$ a method for measuring the co-channel interference from first tier co-channel interferers (i.e., $BS_2$ through $BS_7$), as well as co-channel interferers from higher tiers. This method is applied throughout the radio communication system for all coverage zones 402 and coverage zone clusters 404 simultaneously prior to the transmission of an analog voice message. However, base stations 116 which do not intend to transmit a voice frame remain silent for all tone slots, and thus do not contribute as co-channel interferers during the measurement process. During the simultaneous transmission of all coverage zones 402 and associated coverage zone clusters 404 in the radio communication system, the portable subscriber unit 122 within the coverage zone 402 of $BS_1$, for example, measures interference comprising co-channel interference and adjacent channel interference, plus noise comprising ambient noise and receiver noise of the radio communication system.

The portable subscriber unit 122 is also programmed to determine the home silence slot in cases where the home silence slot location is not provided in the outbound message. In order to determine the home silence slot, the processing system 310 of the portable subscriber unit 122 is programmed to first measure the mean pilot power $P_{mx}$ corresponding to each SQM slot ($P_{m1}$ through $P_{m4}$), and the mean power of the interference plus noise (I+N) for each SQM slot ($I_{m1}$ through $I_{m8}$), all expressed in milli-watts. During the demodulation process of the LSB and USB signals, the processing system 310 of the portable subscriber unit 122 is programmed to divide the side band signals by the mean power of the pilot, thus normalizing variations in the received signals. However, during conditions which degrade the pilot carrier mean power (e.g., fading), dividing the side bands by the mean power of the pilot signal results in an increase of the I+N intercepted by the portable subscriber unit 122. For this reason, during detection of the home silence slot, the demodulated signal is multiplied by the mean pilot power of its corresponding SQM slot resulting in the products $P_{m1}I_{m1}$, $P_{m1}I_{m2}$, $P_{m2}I_{m3}$, $P_{m2}I_{m4}$, $P_{m3}I_{m5}$, $P_{m3}I_{m6}$, $P_{m4}I_{m7}$, and $P_{m4}I_{m8}$. This removes the normalization step, and results in a true comparison of the mean power of the I+N for each SQM slot.

Since $BS_1$ does not transmit a tone in its home silence slot, the lowest product of $P_{mx}I_{mx}$ identifies the home silence slot, which for this example is $P_{m1}I_{m1}$ for a portable subscriber unit 122 residing in the coverage zone 402 of $BS_1$. Once the home silence slot has been identified, the processing system 310 of the portable subscriber unit 122 is programmed to determine a signal quality threshold (T), which follows the expression $T=S_d-(V_{nm}-I_m)+P_m$, where $S_d$ is a predetermined minimum desired signal to interference plus noise ratio of the signal received by the portable subscriber unit 122, where $V_{nm}$ is a predetermined normal mean power of the analog voice message portion, where $I_m$ is the interference plus noise mean power of the home silence slot (in this example, $I_{m1}$), and wherein $P_m$ is the mean pilot power measured during the SQM period (in this example, $P_{m1}$), all values expressed in dB. The value of $S_d$ is preferably received over-the-air (OTA), and is considered a quality factor defined by the system provider of the radio communication system. The value of $V_{nm}$ is preferably factory programmed into the portable subscriber unit 122. Thus, $S_d$ and $V_{nm}$ are constants.

The equation for T can also be expressed as:

$$T = \frac{S_d \cdot I_m \cdot P_m}{V_{nm}},$$

where $S_d$ is a dimensionless ratio, and T, $I_m$, $P_m$, and $V_{nm}$ are expressed in milli-watts. As discussed above, Sd and $V_{nm}$ are constants, thus the remaining variable for the above equation is $I_m$. For this reason, an increase in $I_m$ results in an increase of T, and a decrease in $I_m$ results in a decrease of T. The threshold equation for T implies that the greater the measured interference plus noise the more pilot signal power is required in the received signal to compensate for the higher interference plus noise. In contrast, the lower the measured interference plus noise, the less pilot signal power is required in the received signal. Since the mean pilot power is expected to track with the mean power of the side bands, T provides a signal quality means to determine the quality of a received signal.

Figure 7:
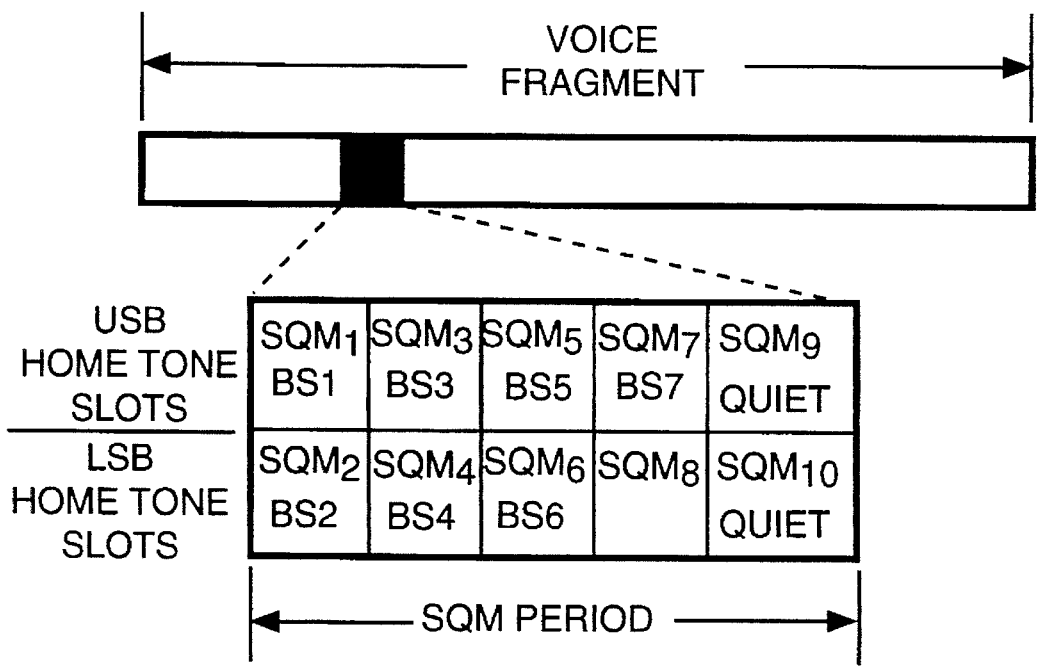

FIG. 7 is a timing diagram of a second embodiment of a plurality of predetermined synchronized signal quality measurement (SQM) slots transmitted with an analog voice message in accordance with the present invention. In the second embodiment of the present invention, the base stations 116 transmit a tone (e.g., 1 KHz) only in a home tone slot. In this arrangement, a portable subscriber unit 122, unaware of the location of its home tone slot, is programmed to measure the mean power of the pilot Pmx corresponding to each SQM slot ($P_{m1}$, $P_{m2}$, $P_{m3}$, $P_{m4}$, and $P_{mq}$), and the mean power of the interference plus noise $I_{mx}$ of each tone slot ($I_{m1}$, $I_{m2}$, $I_{m3}$, $I_{m4}$, $I_{m5}$, $I_{m6}$, $I_{m7}$, $I_{m8}$, and $I_{mq}$), all expressed in milli-watts. As was done above, each component of $I_{mx}$ is multiplied with its corresponding $P_{mx}$ to remove the effects of the normalization step (i.e., $P_{m1}I_{m1}$, $P_{m1}I_{m2}$, $P_{m2}I_{m3}$, $P_{m2}I_{m4}$, $P_{m3}I_{m5}$, $P_{m3}I_{m6}$, $P_{m4}I_{m7}$, $P_{m4}I_m$, and $P_{mq}I_{mq}$). Note, since no tones from any base stations 116 are transmitted during the quiet slots no co-channel interference is present, thus $I_{mq}$ represents primarily the noise component of I+N at the portable subscriber unit 122. Since $BS_1$ transmits a tone in its home tone slot, the highest product of $P_{mx}I_{mx}$ identifies the home tone slot, which for this example is $P_{m1}I_{m1}$ for a portable subscriber unit 122 residing in the coverage zone 402 of $BS_1$. Once the home tone slot has been identified, the portable subscriber unit 122 is programmed to determine the total interference plus noise ($I_{mt}$) of its coverage zone 402 which follows the expression:

$$I_{m_t} = \sum_{x=1}^{N} \frac{I_{m_x} \times P_{m_x}}{P_{m_q}} - (N-1)I_{m_q}$$

For a portable subscriber unit 122 located in the coverage zone 402 of $BS_1$, N=7 (i.e., $I_{mx}$ for $BS_2$ through $BS_8$), and $I_{m1}$ is excluded from the calculation. The term $I_{mx}*P_{mx}/P_{mq}$ moves the normalization reference from $P_{mx}$ to $P_{mq}$. Since each $I_{mx}$ includes a noise component comprising ambient noise, adjacent channel interference from other radio communication systems, and inherent noise from the receiver 304, the summation of the $I_{mx}$ terms adds a set of unnecessary noise components (in this example, 6 additional noise terms). The term $(N-1)*I_{mq}$ removes the additional noise components since $I_{mq}$ is essentially the noise term present at the portable subscriber unit 122. Once $I_{mt}$ has been determined, the processing system 310 of the portable subscriber unit 122 is programmed to determine a signal quality threshold (T), which follows the expression $T=S_d-(V_{nm}-I_{mt})+P_{mq}$, where $S_d$ is a predetermined minimum desired signal to interference plus noise ratio of the signal received by the portable subscriber unit 122, where $V_{nm}$ is a predetermined normal mean power of the analog voice message portion, where $I_{mt}$ is the determined total interference plus noise mean power, and wherein $P_{mq}$ is the mean pilot power measured during the quiet slot, all values expressed in dB. The function of this equation follows the description given above for the first embodiment.

The equation for T can also be expressed as:

$$T = \frac{S_d \cdot I_m \cdot P_m}{V_{nm}},$$

where $S_d$ is a dimensionless ratio, $I_{mt}$, $P_{mq}$, and $V_{nm}$ are expressed in milli-watts.

The first and second embodiments discussed above, utilize methods for determining the home tone slot and quiet slot which required multiplication of the interference plus noise $I_{mx}$ with its corresponding pilot signal $P_{mx}$. This procedure removes the normalization introduced by the demodulator. It will be appreciated that, alternatively, this procedure can be avoided by having the demodulator not divide the signal received from the tone slots by the pilot carrier during signal quality measurements. This reading can be utilized to quicken the determination of the home tone slot and quiet slot (second embodiment only). In addition, the equations for T can be determined such that the pilot term is no longer necessary.

Figure 8:
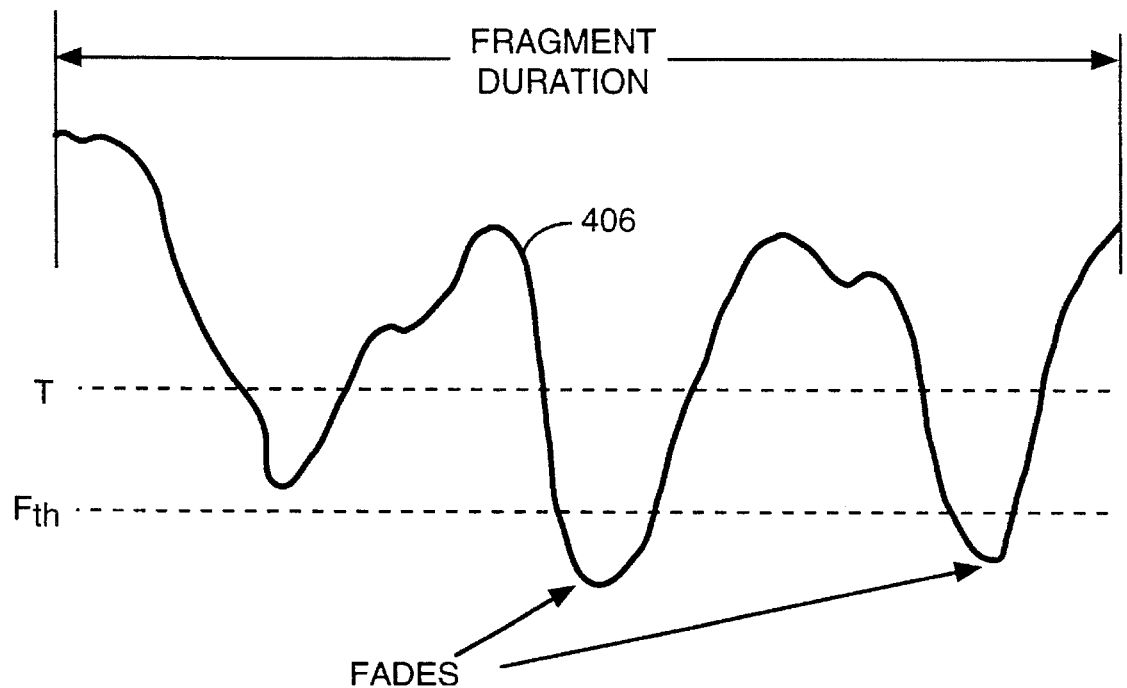
FIG. 8 is a timing diagram representing instantaneous sampling of a plurality of values of pilot carrier power during transmission of the analog voice message, and the fading threshold in accordance with the preferred embodiment of the present invention.

FIG. 8 is a timing diagram representing instantaneous sampling of a plurality of values of pilot carrier power during transmission of the analog voice message, and the fading threshold used to determine when to hold compensation of the demodulator constant at a level corresponding to a pilot signal power level corresponding to a fading threshold $F_{th}$ in accordance with the preferred embodiment of the present invention. The signal 406 represents instantaneous sampling of pilot carrier power. As discussed above, T represents the signal quality threshold tested against the received analog voice signal. To account for fading, the fading threshold ($F_{th}$) is calculated and preferably follows the expression $$F_{th} = T - \max(S_d - 3, 10),$$

all values expressed in dB. The equation can have two forms, that is, for $S_d$ greater than 13 dB, Fth becomes $T - S_d + 3$, and for $S_d$ less than 13 dB, $F_{th}$ becomes $T - 10$. This formula is empirically derived. It will be appreciated that, alternatively, another formula derived analytically and/or empirically can be used.

Figure 9:
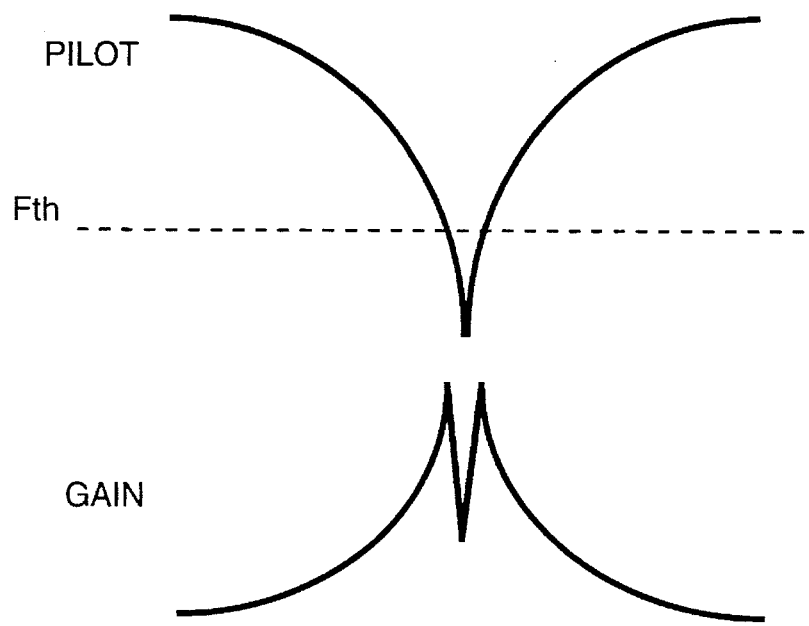
FIG. 9 is a diagram illustrating demodulator compensation below the fading threshold in accordance with the preferred embodiment of the present invention.

FIG. 8 shows two fading conditions where the instantaneous power samples cross $F_{th}$. These crossings are pointed to by arrows. For all pilot power samples falling below $F_{th}$, compensation of the demodulator is adjusted as a function of the pilot signal. During these sample periods, the demodulator compensation equation given above follows the new relation $$I_n(k) + jQ_n(k) = \frac{(I(k) + jQ(k)) \cdot (I_p(k) - jQ_p(k))}{F_{th}} \cdot P_N$$

where $(I_p^2(k) + Q_p^2(k))$ has been replaced by $F_{th}$ (expressed in voltage squared, referenced to an impedance of one ohm). Since $F_{th}$ is constant, $T_n(k) + jQ_n(k)$, the normalized signal is phase compensated, and the gain applied to the SSB signal plus the noise components follows the attenuation of the pilot signal below $F_{th}$ as illustrated in FIG. 9.

During these periods, the analog voice samples contained within the fading regions are only phase compensated and attenuated by the pilot signal power. By not amplitude compensating these samples, the effect of fading is reduced when the user plays back the analog message.

Alternatively in a second embodiment, when the pilot signal traverses $F_{th}$ the compensation equation takes the form $$I_n(k) + jQ_n(k) = \frac{(I(k) + jQ(k)) \cdot (I_p(k) - jQ_p(k))}{(F_{th} \cdot (I_p^2(k) + Q_p^2(k)))^{1/2}} \cdot P_N.$$

As a result, the compensation equation performs phase compensation only. In this equation, however, the gain applied to the SSB signal plus the noise components remains constant below $F_{th}$.

Alternatively in a third embodiment, when the pilot signal traverses $F_{th}$ the compensation equation takes the form $$I_n(k) + jQ_n(k) = I(k) + jQ(k)$$

In this embodiment, below $F_{th}$ the gain is constant and there is no phase compensation.

Figure 10:
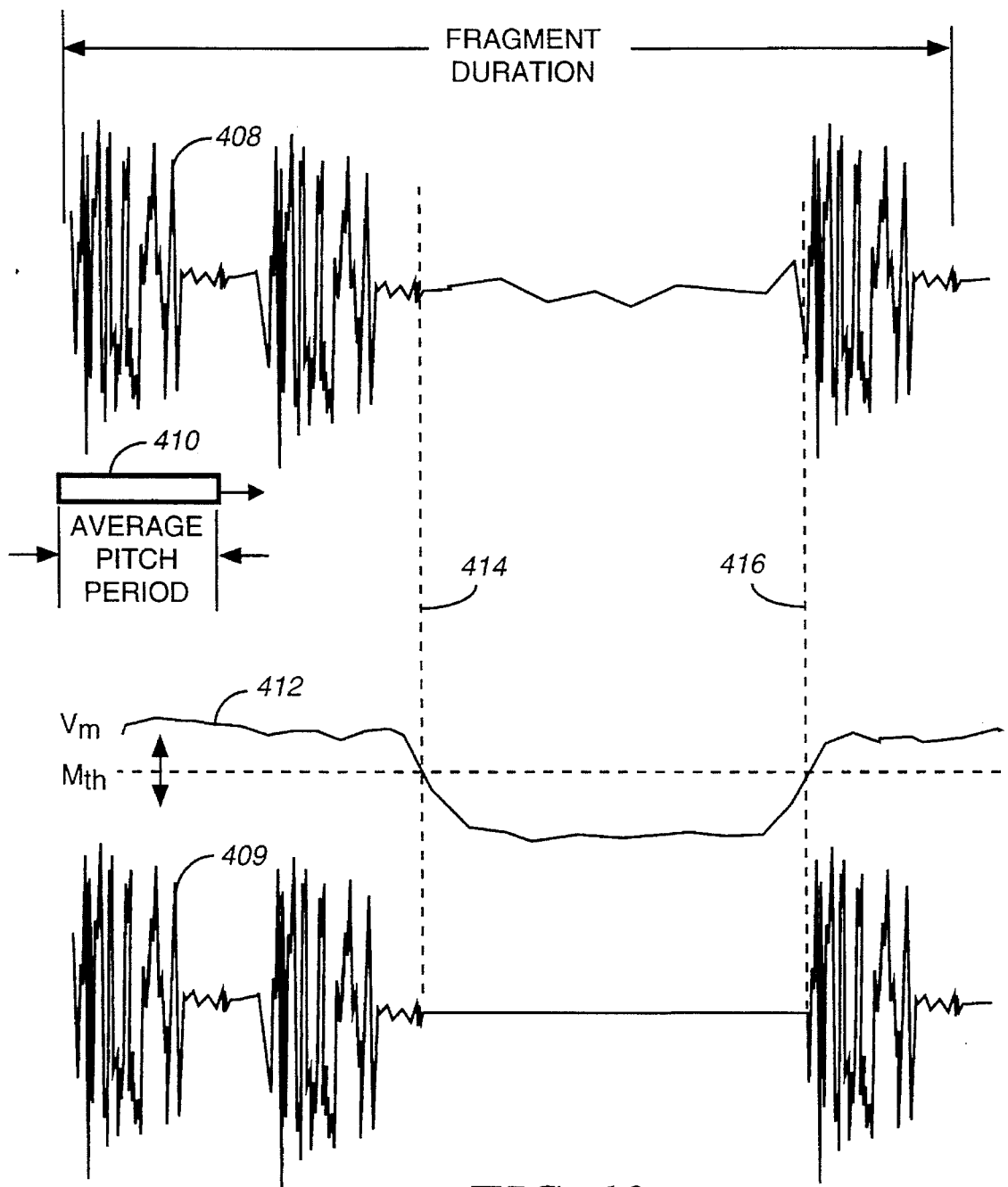
FIG. 10 is a timing diagram representing instantaneous sampling of a plurality of values of the analog voice signal, and the muting threshold in accordance with the preferred embodiment of the present invention.

FIG. 10 is a timing diagram representing instantaneous sampling of a plurality of values of the analog voice signal 408, and the muting threshold $M_{th}$ used to determine when to mute the analog voice signal in accordance with the preferred embodiment of the present invention. An average pitch period 410 is defined for calculating preferably a mean signal power $V_m$ 412. Vm 412 is a running average which is re-calculated every subsequent sample demodulated by the receiver. The average pitch period 410 preferably comprises forty eight discrete samples sampled at a rate of sixty four hundred bits per second. As result, the average pitch period is 7.5 ms in duration. It will be appreciated that, alternatively, other sample sizes and sampling rates may be used such as, for example, ninety six samples at a rate of ninety six hundred samples per second.

If $V_m$ 412 is found to be less than the muting threshold $M_{th}$, then all the analog voice samples of the average pitch period 410 are cleared (i.e., set to zero amplitude). In this example, $V_m$ 412 falls below $M_{th}$ between the boundaries 414 and 416. Before muting, the original analog voice signal 408 illustrates a low signal power level within the boundaries 414 and 416. After muting, the muted analog voice signal 409 shows all discrete samples cleared within the boundaries 414 and 416.

$M_{th}$ preferably follows the expression $$M_{th} = V_{nm} - N_v \text{ (all values expressed in dB)}$$

$V_{nm}$ is the predetermined normal mean power of the message portion described above. Mv is a muting variable preferably following the expression $$M_v = \begin{cases} 6.5 & \text{if } S_{act} < 10 \text{ dB} \\ \dfrac{S_{act}}{2} + 1.5 & \text{if } 10 \text{ dB} < S_{act} \leq 20 \text{ dB} \\ 11.5 & \text{if } S_{act} > 20 \text{ dB} \end{cases}, \text{ and}$$

wherein $s_{act} = P_l + S_d - T$, all values in dB. $P_l$ is a long term pilot mean power calculated preferably over a 200 ms period. During initial processing, $S_{act}$ is set to 20 dB while samples are being accumulated for $P_1$. During the interim period when $S_{act}$ is 20 dB, Mv follows the expression $$M_v = \frac{S_{act}}{2} + 1.5$$

resulting in a value for $M_v$ of 11.5 dB. This in turn results in a constant value for $M_{th}$ which is dependent on the predetermined value for $V_{nm}$. Once 200 ms of samples (1280 samples at 6400 samples per second) have been accumulated, then $S_{act}$ is calculated based on a running average of $P_l$. As a result, the equation for $M_v$ is dependent on the calculated value for $S_{act}$ which in turn is determined from the running average of $P_i$. Since $M_v$ is dependent on value of $S_{aci}$, $M_{th}$ is not constant and can rise and fall as indicated by the arrows in FIG. 10.

Figure 11:
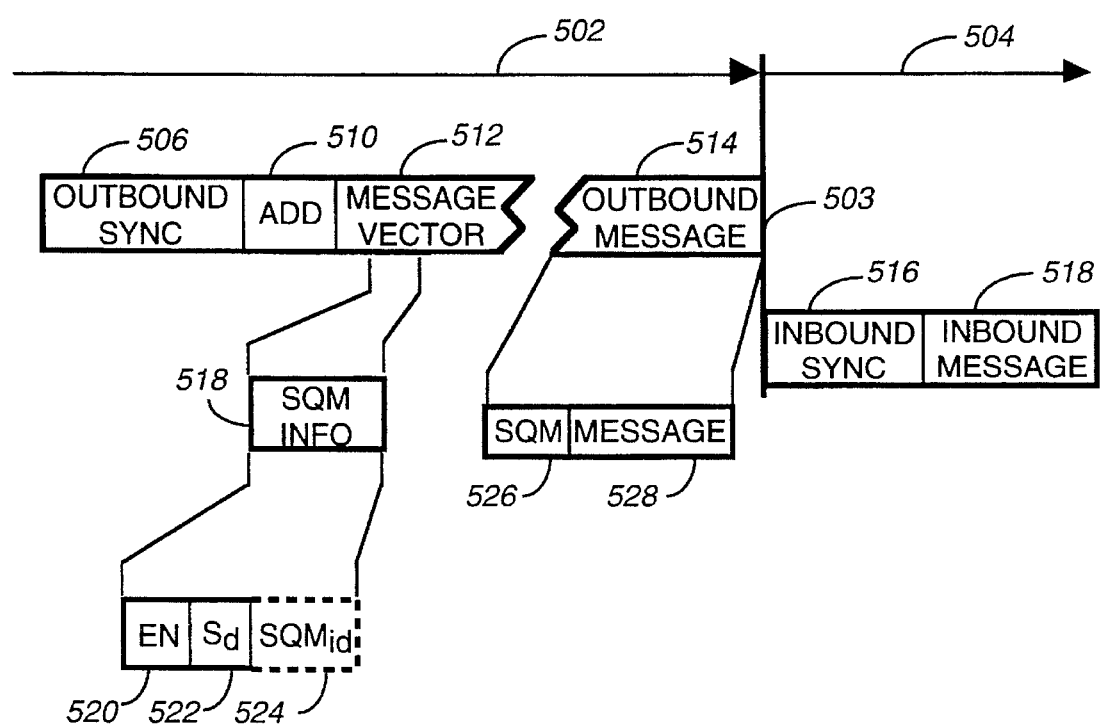
FIG. 11 is a timing diagram of elements of an outbound protocol and an inbound protocol of the fixed and portable portions of the radio communication system in accordance with the preferred embodiment of the present invention.

FIG. 11 is a timing diagram of elements of an outbound protocol and an inbound protocol of the fixed portion 102 and portable portion 104 of the radio communication system in accordance with the preferred embodiment of the present invention. The signaling format operating on the outbound and inbound channels preferably operates on independent frequencies utilizing FDM as described above. Using FDM transmission the outbound RF channel transmission is depicted during an outbound transmission time interval 502, while the inbound RF channel transmission is depicted during an inbound transmission time interval 504. The outbound transmission time interval 502 and the inbound transmission time interval 504 are subdivided by a time boundary 503. The time boundary 503 depicts a point in time before which the outbound transmissions must cease and after which the inbound transmissions can commence.

The elements of the outbound protocol comprise an outbound sync 506, a selective call address 510, a message vector 512 and an outbound message 514, while the inbound protocol comprises an inbound sync 516 and an inbound message 518. The outbound sync 506 provides the portable subscriber unit 122 a means for synchronization utilizing techniques well known in the art. The selective call address 510 identifies the portable subscriber unit 122 for which the outbound message 514 is intended. The message vector 512 points in time within the signal format to the position of the outbound message 514 to be received by the portable subscriber unit 122. In addition, the message vector 512 includes an SQM information field 508. The SQM information field 508 comprises an enable code word 520, and a desired signal to interference plus noise constant $S_{d\ 522}$. The enable code word 520 enables or alternatively disables the signal quality measurement performed by the corresponding portable subscriber unit 122. $S_d$ 522 provides the constant needed in determination of the threshold T equation discussed above. The system provider of the radio communication system preferably defines the desired dB level for $S_d$. In an alternative embodiment of the present invention, the SQM information field 508 also includes an $SQM_{id\ 524}$. The $SQM_{id}$ 524 is used to identify the home silence/tone slot assigned to the coverage zone 402 in which the portable subscriber unit 122 is known to be located, which precludes the need to search for the home silence/tone slot. It will be appreciated that, alternatively, the SQM information field 508 can also be located in any other appropriate portion of the outbound message stream within the outbound transmission time interval 502. The outbound message 514 comprises an SQM period 526 and an analog voice message 528. The SQM period 526 utilized for the determination of the threshold T, as described above.

The inbound sync 516 provides the base stations 116 a means for synchronization utilizing techniques well known in the art. The inbound message 518 preferably comprises an address, an ACK, or a NAK. As mentioned above, the ACK and NAK messages include sufficient information to identify the fragments which need re-transmission and those which do not. It will be appreciated that other message acknowledgment schemes can be used to identify valid and invalid fragments.

Figure 12:
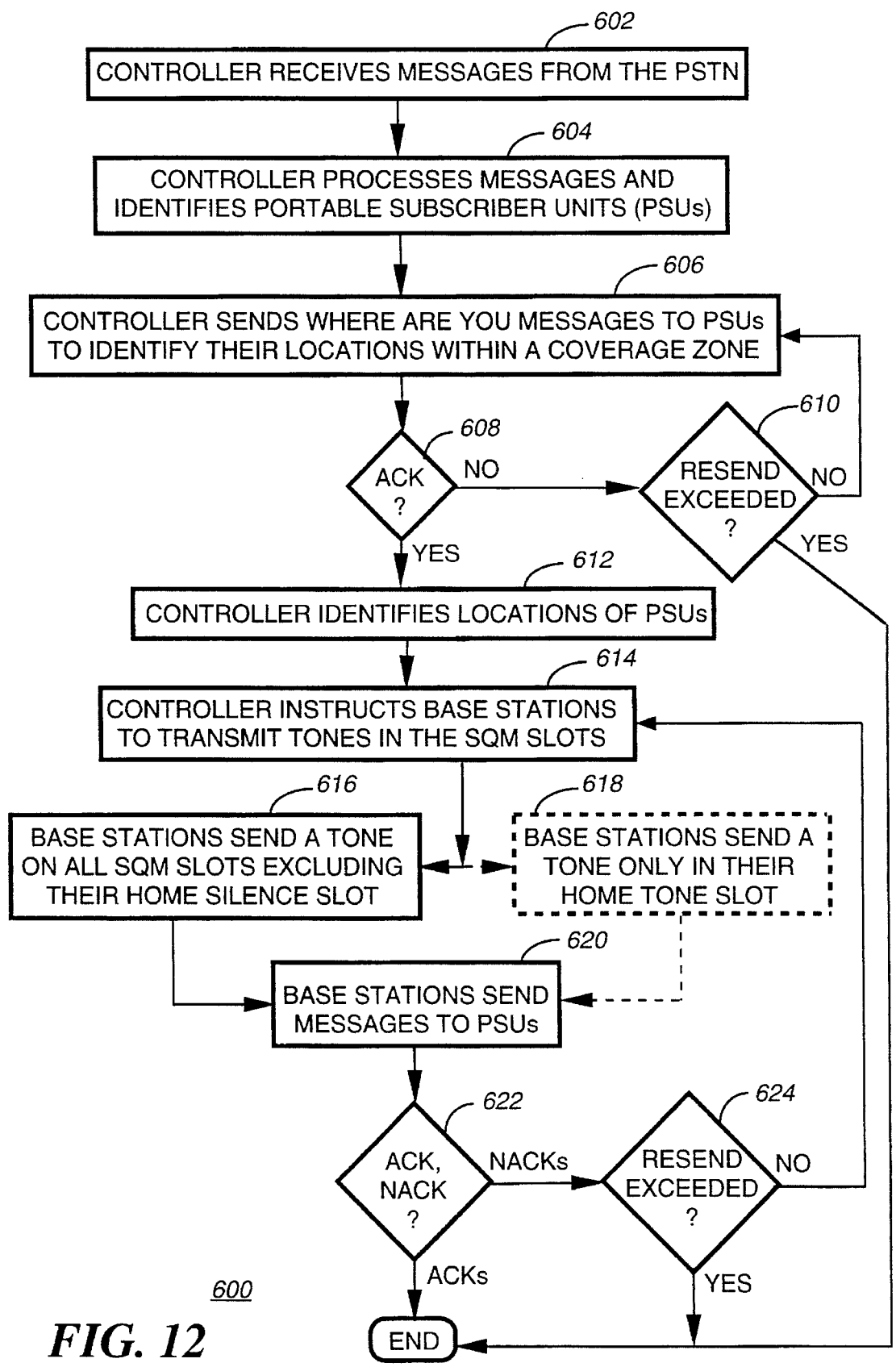
FIG. 12 is a flow chart depicting operation of the fixed portion of the radio communication system in accordance with the preferred embodiment of the present invention.

FIG. 12 is a flow chart depicting operation of the fixed portion 102 of the radio communication system in accordance with the preferred embodiment of the present invention. The flow chart begins with step 602 where the controller 112 receives messages from the PSTN 110 destined for portable subscriber units 122. In step 604 the controller 112 processes the messages and identifies the portable subscriber units 122 identified by pin numbers stored in the mass storage media 214 of the processing system 210 of the controller 112. In step 606 the controller 112 sends where-are-you (WRU) messages transmitted by the base station 116 to the portable subscriber units 122 to identify their locations within one or more coverage zones of the radio communication system. In step 608 the controller 112 waits for acknowledgments from the portable subscriber unit 122 which identifies their coverage zone. For those portable subscriber units 122 which do not respond, the controller 112 proceeds to step 610 where it determines if a resend count has been exceeded, and if not the WRU message is re-transmitted in step 606. Otherwise, transmission for the non-responsive portable subscriber unit(s) 122 is terminated.

Once the portable subscriber units 122 have been identified by coverage zones in step 612, the controller 112 proceeds to step 614 where it sends instructions to the base station 116 to transmit tones in the SQM slots as prescribed by one of the two embodiments described above for FIG. 6. In the first embodiment the base stations 116 proceed to step 616 where they transmit tones on all SQM slots excluding the home silence slot. In the ZL0 second embodiment the base stations 116 proceed to step 618 where they transmit a tone only in their home tone slot. As described above, the SQM period occurs simultaneously for all coverage zones throughout the radio communication system. In step 620 the base stations 116 transmit the analog voice message comprising the USB, LSB and pilot. In step 622 the controller 112 waits for an ACK or NAK response from the portable subscriber units 122. For NAKs, the controller 112 proceeds to step 624 where it determines if the NAKed fragments have exceeded their respective resend count. If not, then the controller 112 proceeds to steps 614, 616 (or 618), and 620. Once all fragments have been ACKed, transmission ceases for each corresponding portable subscriber unit 122.

Figure 13:
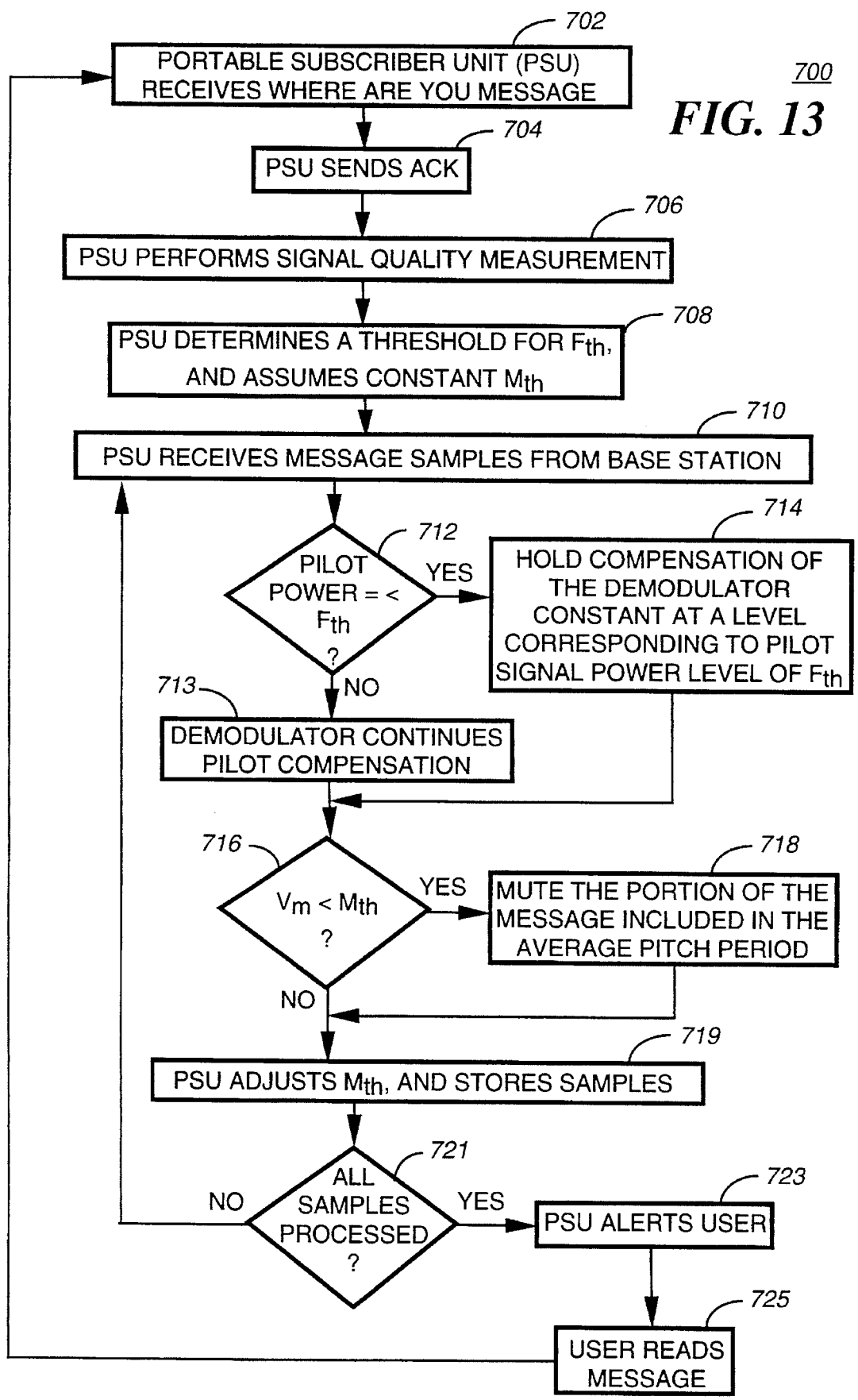
FIG. 13 is a flow chart depicting operation of the portable subscriber unit in accordance with the preferred embodiment of the present invention.

FIG. 13 is a flow chart depicting operation of the portable subscriber unit 122 in accordance with the preferred embodiment of the present invention. The portable subscriber unit 122 begins with step 702 where it receives the WRU message sent by the base stations 116. The portable subscriber unit 122 proceeds to step 704 where it sends an ACK message identifying itself. In step 706 the portable subscriber unit 122 performs a signal quality measurement during the SQM period to determine a threshold T to compare against the pilot carrier received in the expected analog voice message transmitted by the base station 116 after the SQM period. In step 708 the portable subscriber unit 122 determines a threshold for $F_{th}$ and assumes a constant $M_{th}$ based on the initial fixed value of 20 dB set for $S_{aci}$, as described above.

In step 710 the portable subscriber unit 122 receives message fragments from the base station 710. In step 712 the portable subscriber unit 122 determines if the pilot signal power is less than or equal to $F_{th}$. If it is, then the portable subscriber unit 122 proceeds to step 714 where it holds compensation of the demodulator constant at a level corresponding to $F_{th}$. If pilot signal power is greater than $F_{th}$, then the portable subscriber unit 122 proceeds to step 713 where the demodulator continues pilot compensation of the received analog voice message.

In step 716 the portable subscriber unit 122 checks if $V_m$ (mean analog voice message power) is less than $M_{th}$. If $V_m$ is less than $M_{th}$, then in step 718 the portable subscriber unit 122 mutes the portion of samples included in the average pitch period 410. If $V_m$ is greater than $M_{th}$, then the portable subscriber unit 122 proceeds to step 719 where it adjusts $M_{th}$, and stores the message samples in RAM 312. In step 721 the portable subscriber unit 122 checks for processing of all message fragments. If all fragments have been received and processed, then the portable subscriber unit 122 proceeds to step 723 where it alerts the user to the pending message. In step 725 the user reads the message by utilizing appropriate functions provided by the user controls 320. If not all the message fragments have been processed, then the portable subscriber unit 122 continues message fragment processing starting at step 710.

Figure 14:
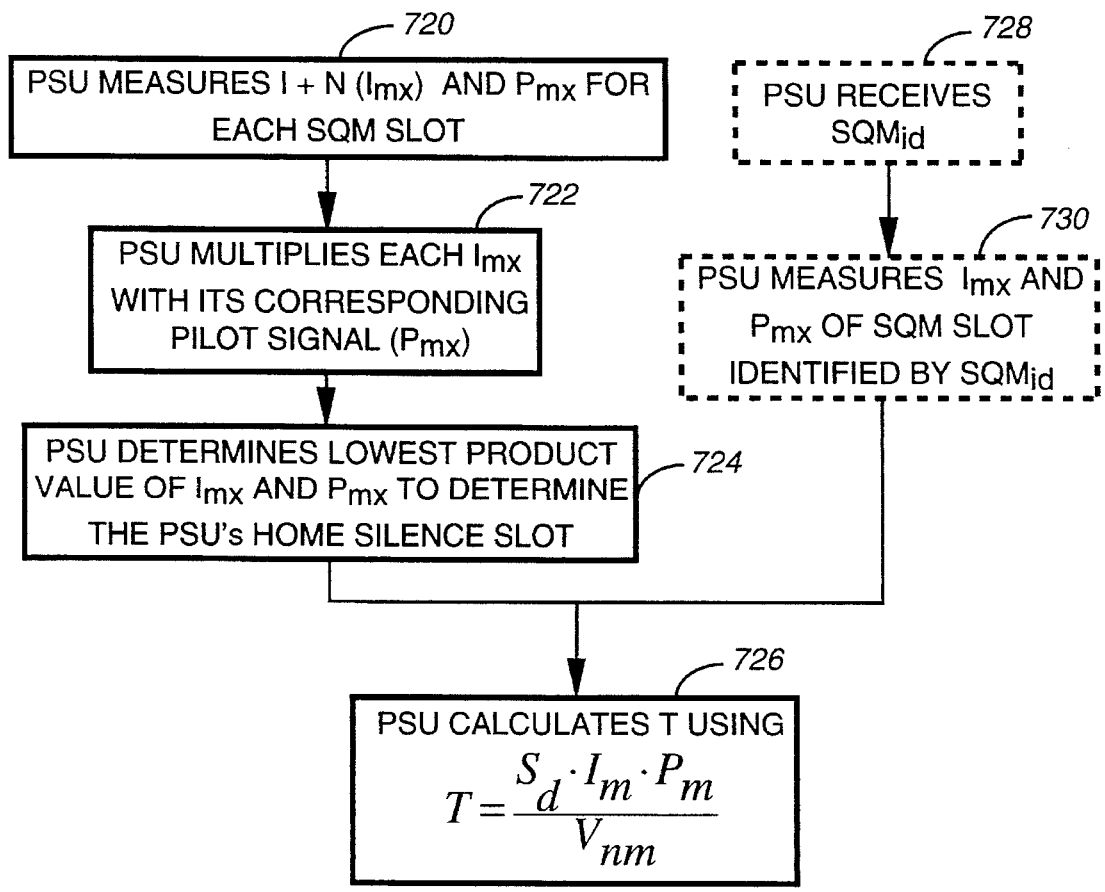
FIGS. 14 and 15 are flow charts depicting first and second embodiments of the operation of the portable subscriber unit in accordance with the present invention.

FIG. 14 is a flow chart depicting a first embodiment of the operation performed by the portable subscriber unit 122 to determine a signal quality threshold of the receive analog voice message in accordance with the present invention. In this embodiment the portable subscriber unit 122 begins with step 720 where it measures the interference plus noise (I+N, or alternatively $I_{mx}$) for each SQM slot, and the mean pilot power $P_{mx}$ for each SQM slot. In step 722 the portable subscriber unit 122 multiplies each $I_{mx}$ with its corresponding pilot signal $P_{mx}$. In step 724 the portable subscriber unit 122 determines the home silence slot from the lowest product of $I_{mx}$ and $P_{mx}$. In step 726 the portable subscriber unit 122 determines the threshold T, as described above. In an alternative embodiment, the portable subscriber unit 122 receives the $SQM_{id}$ 524 on the outbound channel in step 728 identifying the home silence slot. Consequently, in step 730 the portable subscriber unit 122 measures $I_{mx}$ and $P_{mx}$ of the home silence slot directly, and proceeds to step 726 to determine the threshold T.

Figure 15:
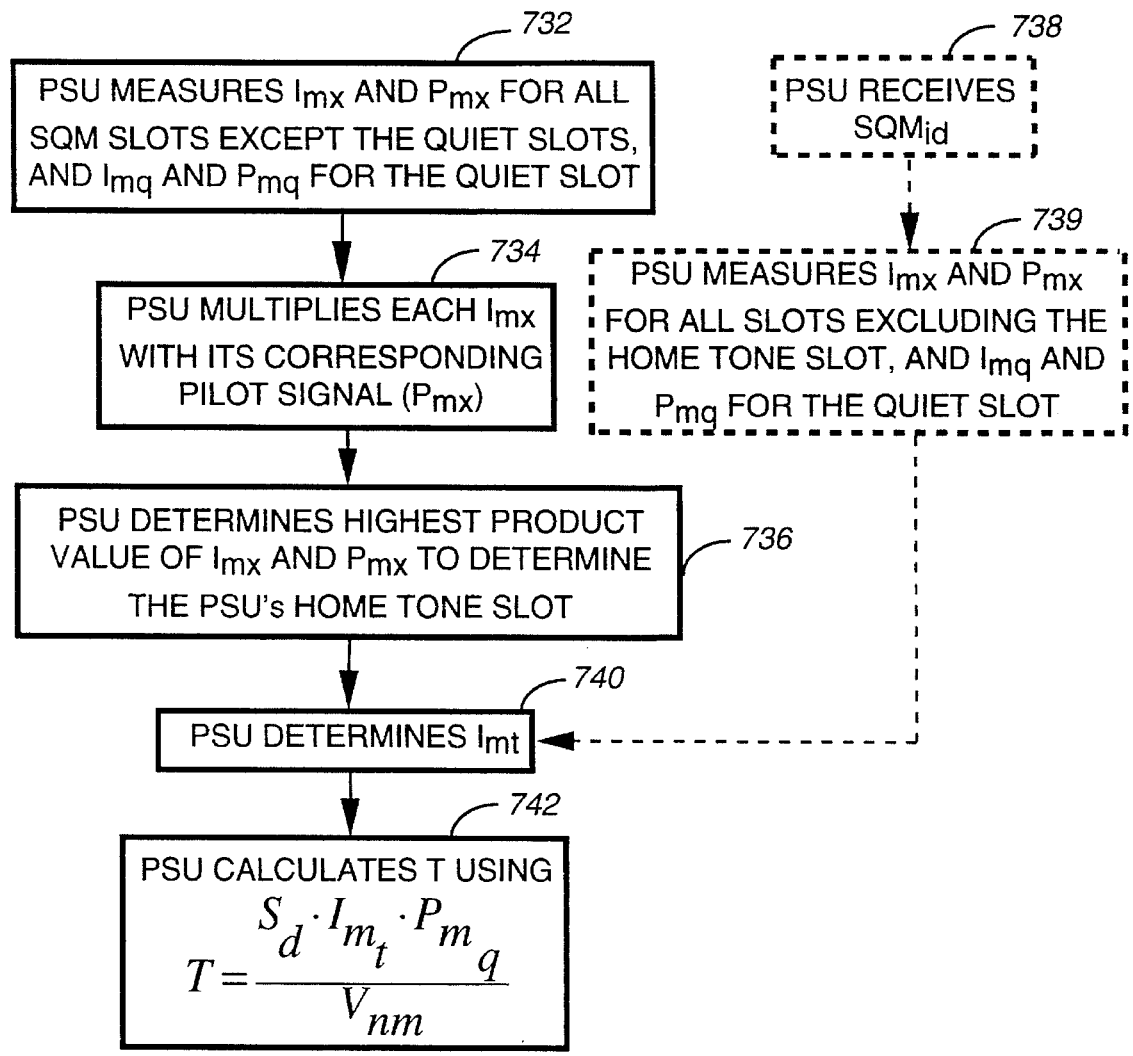

FIG. 15 is a flow chart depicting the second embodiment of the operation performed by the portable subscriber unit 122 to determine a signal quality threshold of the receive analog voice message in accordance with the present invention. In this embodiment the portable subscriber unit 122 begins with step 732 where it measures $I_{mx}$, and Pmx for each SQM slot, other than the quiet slots, and Imq and Pmq for the quiet slots. In step 734 the portable subscriber unit 122 multiplies each $I_{mx}$ with its corresponding pilot signal $P_{mx}$. In step 736 the portable subscriber unit 122 determines the home tone slot from the highest product of $I_{mx}$ and $P_{mx}$. In step 740 the portable subscriber unit 122 determines the total interference plus noise ($I_{mt}$) utilizing the method and equation described above for the second embodiment. In step 742 the portable subscriber unit 122 determines the threshold T, as described above. It will be appreciated that, alternatively, the portable subscriber unit 122 receives the $SQM_{id}$ 524 on the outbound channel in step 738 identifying the home tone slot. Consequently, in step 739 the portable subscriber unit 122 measures $I_{mx}$ for each tone slot excluding the home tone slot, Pmx for each SQM slot, and Imq and Pmq for the quiet slot. The portable subscriber unit 122 then proceeds to step 740 and 742, as described above.

Thus, it should be apparent by now that the present invention provides a method and apparatus in a radio communication system for mitigating noise and interference effects on analog messages. In particular, the invention advantageously provides a method and apparatus for error mitigation of an impaired analog message. The invention advantageously provides a method for correcting extreme fading conditions. In addition, the invention advantageously mutes samples in the analog message which have low signal power negligibly above the noise level of the receiver 304 and measured system interference. As a result, unpleasant noise effects encountered during transmission of the analog message from the base stations 116 are suppressed by the portable subscriber unit 122 in accordance with the present invention.

What is claimed is:

1. A method for mitigating effects of multipath fading, interference, and noise in a single sideband (SSB) signal transmitted by a radio communication system and demodulated by a portable subscriber unit utilizing a demodulator compensated by a pilot signal, the method comprising in the portable subscriber unit the steps of:

calculating a pilot fading threshold $F_{th}$, wherein $F_{th}$ is calculated as a first predetermined function of a pilot threshold T and a predetermined desired signal/noise ratio $S_d$; and adjusting compensation of the demodulator whenever pilot signal power is equal to or less than $F_{th}$.

2. The method of claim 1, wherein the radio communication system comprises a plurality of transmitters which produce co-channel interference signals where the portable subscriber unit is located, and wherein the radio communication system periodically transmits signal quality measurement signals utilized by the portable subscriber unit for performing signal quality measurements, and wherein the calculating step comprises in the portable subscriber unit the steps of:

receiving the signal quality measurement signals; and determining from the signal quality measurement signals a mean side band power $I_m$ representing interference+noise and a mean pilot carrier power $P_m$.

3. The method of claim 2, wherein the pilot threshold T is defined by $$T = \frac{S_d \cdot I_m \cdot P_m}{V_{nm}}, \text{ and}$$

wherein $V_{nm}$ is a predetermined normal mean power of a message portion of the SSB signal.

4. The method of claim 3, wherein for values of $S_d$ greater than a first predetermined value, the pilot fading threshold $F_{th}$ is defined by $$F_{th} = T - S_d + K,$$

all values in decibels, wherein K is a second predetermined value.

5. The method of claim 4, wherein the pilot fading threshold $F_{th}$ is defined by $$F_{th} = T - \max(S_d - 3, 10),$$

all values in decibels.

6. The method of claim 1, further comprising in the portable subscriber unit the steps of:

calculating a muting threshold $M_{th}$, wherein $M_{th}$ is calculated as a second predetermined function of the pilot threshold T, the predetermined desired signal/noise ratio $S_d$, a predetermined mean power $V_{nm}$ of a message portion of the SSB signal, and a long term pilot mean power $P_1$ of the pilot signal;

calculating a mean signal power $V_m$ in a predetermined portion of the message portion of the SSB signal;

comparing the mean signal power $V_m$ to the muting threshold $M_{th}$; and muting the predetermined portion of the message portion, in response to the mean signal power $V_m$ being less than the muting threshold $M_{th}$.

7. The method of claim 6, wherein $M_{th}$ is defined by $$M_{th}=V_{nm}-M_v,$$

and $$\text{wherein } M_v = \begin{cases} 6.5 & \text{if } S_{act} < 10 \text{ dB} \\ \dfrac{S_{act}}{2}+1.5 & \text{if } 10 \text{ dB} < S_{act} \leq 20 \text{ dB} \\ 11.5 & \text{if } S_{act} > 20 \text{ dB} \end{cases}, \text{ and}$$

wherein $S_{act}=P_1+S_d-T$, all values in decibels.

8. A portable subscriber unit for mitigating effects of multipath fading, interference, and noise in a single sideband (SSB) signal transmitted by a radio communication system and demodulated by the portable subscriber unit utilizing a demodulator compensated by a pilot signal, the portable subscriber unit comprising:

a receiver for receiving the SSB signal;

a processing system coupled to the receiver for controlling operation of the portable subscriber unit; and a power measurement element coupled to the receiver and coupled to the processing system for measuring mean power received in portions of the SSB signal, wherein the receiver comprises a demodulator coupled to the processing system and compensated by a pilot signal, and wherein the processing system is programmed for calculating a pilot fading threshold $F_{th}$, wherein $F_{th}$ is calculated as a first predetermined function of a pilot threshold T and a predetermined desired signal/noise ratio $S_d$, and wherein the processing system is further programmed for adjusting compensation of the demodulator whenever pilot signal power is equal to or less than $F_{th}$.

9. The portable subscriber unit of claim 8, wherein the radio communication system comprises a plurality of transmitters which produce co-channel interference signals where the portable subscriber unit is located, and wherein the radio communication system periodically transmits signal quality measurement signals utilized by the portable subscriber unit for performing signal quality measurements, and wherein the processing system is further programmed for receiving the signal quality measurement signals; and determining from the signal quality measurement signals a mean side band power $I_m$ representing interference+noise and a mean pilot carrier power $P_m$.

10. The portable subscriber unit of claim 9, wherein the pilot threshold T is defined by $$T=\dfrac{S_d \cdot I_m \cdot P_m}{V_{nm}}, \text{ and}$$

wherein $V_{nm}$ is a predetermined normal mean power of a message portion of the SSB signal.

11. The portable subscriber unit of claim 10, wherein for values of $S_d$ greater than a first predetermined value, the pilot fading threshold $F_{th}$ is defined by $$F_{th}=T-S_d+K,$$

all values in decibels, wherein K is a second predetermined value.

12. The portable subscriber unit of claim 11, wherein the pilot fading threshold $F_{th}$ is defined by $$F_{th}=T-\max(S_d,3,10),$$

all values in decibels.

13. The portable subscriber unit of claim 8, wherein the processing system is further programmed for:

calculating a muting threshold $M_{th}$, wherein $M_{th}$ is calculated as a second predetermined function of the pilot threshold T, the predetermined desired signal/noise ratio $S_d$, a predetermined mean power $V_{nm}$ of a message portion of the SSB signal, and a long term pilot mean power $P_1$ of the pilot signal;

calculating a mean signal power $V_m$ in a predetermined portion of the message portion of the SSB signal;

comparing the mean signal power $V_m$ to the muting threshold $M_{th}$; and muting the predetermined portion of the message portion, in response to the mean signal power $V_m$ being less than the muting threshold $M_{th}$.

14. The portable subscriber unit of claim 13, wherein $M_{th}$ is defined by $$M_{th}=V_{nm}-M_v,$$

and $$\text{wherein } M_v = \begin{cases} 6.5 & \text{if } S_{act} < 10 \text{ dB} \\ \dfrac{S_{act}}{2}+1.5 & \text{if } 10 \text{ dB} < S_{act} \leq 20 \text{ dB} \\ 11.5 & \text{if } S_{act} > 20 \text{ dB} \end{cases}, \text{ and}$$

wherein $$S_{act}=P_1+S_d-T,$$

all values in decibels.

15. A radio communication system for mitigating effects of multipath fading, interference, and noise in a single sideband (SSB) signal transmitted by the radio communication system and demodulated by a portable subscriber unit utilizing a demodulator compensated by a pilot signal, the radio communication system comprising:

a controller, comprising:

a first processing system for controlling operation of the controller;

an input interface coupled to the first processing system for accepting a message from a message originator; and a transmitter controller coupled to the first processing system for controlling a plurality of transmitters positioned in a plurality of coverage zones;

wherein the radio communication system further comprises:

the plurality of transmitters coupled to the controller for transmitting the SSB signal; and the portable subscriber unit, comprising:

a receiver for receiving the SSB signal;

a second processing system coupled to the receiver for controlling operation of the portable subscriber unit; and a power measurement element coupled to the receiver and coupled to the second processing system for measuring mean power received in portions of the SSB signal, wherein the receiver comprises a demodulator coupled to the second processing system and compensated by a pilot signal, and wherein the second processing system is programmed for calculating a pilot fading threshold $F_{th}$, wherein $F_{th}$ is calculated as a first predetermined function of a pilot threshold T and a predetermined desired signal/noise ratio $S_d$, and wherein the second processing system is further programmed for adjusting compensation of the demodulator whenever pilot signal power is equal to or less than $F_{th}$.

16. The radio communication system of claim 15, wherein the plurality of transmitters produce co-channel interference signals where the portable subscriber unit is located, and wherein the radio communication system periodically transmits signal quality measurement signals utilized by the portable subscriber unit for performing signal quality measurements, and wherein the second processing system is further programmed for controlling the receiver to receive the signal quality measurement signals; and determining from the signal quality measurement signals a mean side band power $I_m$ representing interference+ noise and a mean pilot carrier power $P_m$.

17. The radio communication system of claim 16, wherein the pilot threshold T is defined by $$T = \frac{S_d \cdot I_m \cdot P_m}{V_{nm}}, \text{ and}$$

wherein $V_{nm}$ is a predetermined normal mean power of a message portion of the SSB signal.

18. The radio communication system of claim 17, wherein for values of $S_d$ greater than a first predetermined value, the pilot fading threshold $F_{th}$ is defined by $$F_{th} = T - S_d + K,$$

all values in decibels, wherein K is a second predetermined value.

19. The radio communication system of claim 18, wherein the pilot fading threshold $F_{th}$ is defined by $$F_{th} = T - \max(S_d - 3, 30),$$

all values in decibels.

20. The radio communication system of claim 15, wherein the second processing system is further programmed for:

calculating a muting threshold $M_{th}$, wherein $M_{th}$ is calculated as a second predetermined function of the pilot threshold T, the predetermined desired signal/noise ratio $S_d$, a predetermined mean power $V_{nm}$ of a message portion of the SSB signal, and a long term pilot mean power $P_1$ of the pilot signal;

calculating a mean signal power $V_m$ in a predetermined portion of the message portion of the SSB signal;

comparing the mean signal power $V_m$ to the muting threshold $M_{th}$; and muting the predetermined portion of the message portion, in response to the mean signal power $V_m$ being less than the muting threshold $M_{th}$.

21. The radio communication system of claim 20, wherein $M_{th}$ is defined by $$M_{th} = V_{nm} - M_v,$$

and $$\text{wherein } M_v = \begin{cases} 6.5 & \text{if } S_{act} < 10 \text{ dB} \\ \frac{S_{act}}{2} + 1.5 & \text{if } 10 \text{ dB} < S_{act} \leq 20 \text{ dB} \\ 11.5 & \text{if } S_{act} > 20 \text{ dB} \end{cases}, \text{ and}$$

wherein $$S_{act} = P_1 + S_d - T,$$

all values in decibels.

* * * * *